(12) United States Patent
Larsen (10) Patent No.: US 8,723,586 B1
(45) Date of Patent: May 13, 2014

(54) CHARGE MEASUREMENT

(71) Applicant: Atmel Corporation, San Jose, CA (US)

(72) Inventor: Fredrik Larsen, Trondheim (NO)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 13/667,171

(22) Filed: Nov. 2, 2012

(51) Int. Cl.
*G06G 7/18* (2006.01)

(52) U.S. Cl.
USPC .......................... 327/339; 327/345; 324/678

(58) Field of Classification Search
USPC .............. 324/678; 327/336, 339, 341, 345
See application file for complete search history.

(56) References Cited

U.S. PATENT DOCUMENTS

| | | | | |
|---|---|---|---|---|
| 4,225,825 A | * | 9/1980 | Watts | 327/134 |
| 4,825,147 A | * | 4/1989 | Cook et al. | 324/678 |
| 5,576,628 A | * | 11/1996 | Caliboso et al. | 324/678 |
| 5,852,359 A | * | 12/1998 | Callahan et al. | 323/274 |
| 6,624,640 B2 | * | 9/2003 | Lund et al. | 324/678 |
| 7,830,157 B2 | * | 11/2010 | Geaghan | 324/678 |
| 2002/0176188 A1 | * | 11/2002 | Ruegg et al. | 360/46 |
| 2008/0036473 A1 | * | 2/2008 | Jansson | 324/678 |
| 2009/0322711 A1 | * | 12/2009 | David et al. | 345/204 |
| 2012/0274296 A1 | * | 11/2012 | Higuchi et al. | 323/282 |

* cited by examiner

*Primary Examiner* — William Hernandez
(74) *Attorney, Agent, or Firm* — Fish & Richardson P.C.

(57) ABSTRACT

An apparatus comprises a comparator that includes a first input, a second input and an output. The comparator is configured for measuring a difference in voltage between a source coupled to the first input and another source coupled to the second input, and providing information associated with the measured difference at the output. The apparatus also comprises a controllable current source coupled to the first input of the comparator and configured for supplying or drawing current. The apparatus also comprises a digital logic circuit that is configured for controlling an amount of current supplied or drawn by the controllable current source. The apparatus is configured for measuring a charge associated with an external source that is coupled to the first input of the comparator.

22 Claims, 5 Drawing Sheets

CHARGE MEASUREMENT

TECHNICAL FIELD

This disclosure relates generally to charge measurement using an integrator.

BACKGROUND

An integrator is a device that generally outputs a signal proportional to the time integral of the input. The input and output of the integrator may be either a voltage or a current signal.

SUMMARY

In one general aspect, an apparatus comprises a comparator that includes a first input, a second input and an output. The comparator is configured for measuring a difference in voltage between a source coupled to the first input and another source coupled to the second input, and providing information associated with the measured difference at the output of the comparator. The apparatus also comprises a controllable current source that includes an output coupled to the first input of the comparator and configured for supplying or drawing current.

In addition, the apparatus comprises a digital logic circuit that includes an input coupled to the output of the comparator and an output coupled to an input of the controllable current source. The digital logic circuit is configured for controlling an amount of current supplied or drawn by the controllable current source. The apparatus is configured for regulating a voltage associated with an external source that is coupled to the first input of the comparator and keeps track of the charge used to regulate the voltage. In some implementations, voltage regulation is performed by starting at a reference voltage, introducing a charge, and then regulating back to the reference voltage. In this manner, the charge that is added can be measured.

Particular implementations of the apparatus may include one or more of the following features. The digital logic circuit may be configured to use successive approximation to control the amount of current supplied or drawn by the controllable current source such that a voltage at the first input of the comparator due to the charge associated with an external source approaches the reference voltage. By supplying or drawing the current, an amount of charge proportional to the amount of current supplied or drawn, and the time for which the current is supplied or drawn, may be added or removed, respectively.

The apparatus may be configured for providing a digital output proportional to the measured charge associated with the external source. The digital output may be provided without using an analog to digital converter (ADC) by the apparatus.

The apparatus may be configured for integrating a current associated with the external source. The apparatus may be configured for measuring a voltage associated with the external source. The apparatus may be configured for measuring a capacitance associated with the external source.

The controllable current source may include a digital to analog converter circuit (DAC) that is configured for providing a current at the output of the controllable current source. The digital logic circuit may be configured for regulating a voltage associated with the external source at the first input of the comparator by controlling the controllable current source such that an amount of the current provided by the controllable current source is controlled.

The digital logic circuit may comprise a digital filter that includes an input coupled to the output of the comparator. The digital filter may be configured for producing at an output of the digital filter a filtered version of the information at the output of the comparator.

The digital logic circuit also may comprise a delay circuit that includes an input coupled to the output of the digital filter. The delay circuit may be configured for providing at an output of the delay circuit a delayed version of the filtered information produced by the digital filter.

The delay circuit may be configured to delay the filtered information produced by the digital filter by a time step of a clock signal provided to the digital logic circuit such that the output of the delay circuit follows the output of the digital filter delayed by the time step.

The digital logic circuit also may comprise an exclusive-or (XOR) circuit that includes a first input coupled to the output of the digital filter and a second input coupled to the output of the delay circuit. The XOR circuit may be configured for providing an UPDATE signal at an output of the XOR circuit.

The UPDATE signal may be based on a difference between the output of the digital filter and the output of the delay circuit. The UPDATE signal may indicate when a voltage at the first input of the comparator that is produced due to the external source and the current supplied or drawn by the controllable current source crosses the reference voltage.

The digital logic circuit also may comprise a control setting circuit that includes a first input coupled to the output of the XOR circuit for receiving the UPDATE signal, a second input for receiving a RESET signal and a third input coupled to the output of the digital filter. In addition, the control setting circuit may include an output coupled to the input of the controllable current source. The control setting circuit may be configured for controlling an active current configuration of the controllable current source.

The control setting circuit may be configured for providing control information for controlling the active current configuration of the controllable current source based on the UPDATE signal and the filtered information produced by the digital filter. The control information may be configured to drive the controllable current source to source current or sink current based on a sign of the filtered information produced by the digital filter.

The digital logic circuit also may comprise a digital accumulator that includes a first input coupled to the output of the control setting circuit for measuring an amount of current supplied or drawn by the controllable current source, a second input for receiving the RESET signal and an output for providing a RESULT signal that is proportional to the charge associated with the external source.

The digital accumulator may be configured for accumulating a value proportional to the amount of charge supplied to or drawn from the external source based on current supplied or drawn by the controllable current source and a time for which the current is supplied or drawn, an amount of the current being based on successive control information provided at the output of the control setting circuit for controlling the active current configuration of the controllable current source during a measurement cycle.

The digital logic circuit also may comprise a compensation circuit that includes an input coupled to the output of the control setting circuit and an output coupled to the input of the digital accumulator. The compensation circuit may be configured for coupling the control setting circuit and the digital accumulator, and compensating the amount of current supplied or drawn by the controllable current source based on a digital lookup table. The compensated amount of current may be provided to the digital accumulator at the output of the compensation circuit.

A dynamic range or resolution of the apparatus may be controlled by digitally controlling the time step of the clock signal. The resolution of the apparatus is based on the minimum possible charge that can be sinked or sourced. Since charge is a function of current and time, resolution is a function of the minimum current and minimum time step of the clock signal (that is, the maximum clock frequency). The dynamic range is based on the integration time and may be increased by increasing the integration time. In this context, the integration time is the time for which the current is supplied or drawn by the by the controllable current source.

The RESET signal may be configured for resetting the control setting circuit to a base setting when a new measurement is to be made. The base setting of the control setting circuit may be configured to control the controllable current source such that a maximum amount of current is supplied or drawn by the controllable current source.

The apparatus also may comprise a controllable voltage source coupled to the second input of the comparator and configured for providing a reference voltage. Alternatively, the apparatus may comprise a static voltage source.

In another general aspect, an external source is coupled to a first input of a comparator included in an integrator circuit for measuring a voltage proportional to a first amount of charge associated with the external source. A supplementary charge is added to the external source using a controllable current source included in the integrator circuit that is coupled to the external source. The supplementary charge is due to a current provided by the controllable current source. A difference between a voltage at the first input of the comparator due to the external source and a reference voltage coupled to the second input of the comparator is measured using the comparator. An amount of the current provided by the controllable current source is adjusted based on measuring the difference. The amount of current is adjusted in successive steps of a clock signal such that the voltage at the first input of the comparator approaches the reference voltage. It is determined whether the voltage at the first input of the comparator has crossed the reference voltage based on a sign of the measured difference at an output of the comparator. Responsive to determining that the voltage at the first input of the comparator has crossed the reference voltage, the amount of current provided by the controllable current source is adjusted by reversing a direction of the current. Adjusting the amount of current also includes adjusting the strength of the current.

A value proportional to an amount of charge is accumulated using a digital accumulator included in the integrator circuit. The amount of charge is proportional to the current provided by the controllable current source and an amount of time for which current is provided by the controllable current source. It is determined whether a minimum setting for the current provided by the controllable current source is reached. Based on determining that the minimum setting for the current provided by the controllable current source is reached, the accumulated value proportional to the amount of charge is provided at the output of the digital accumulator as an indication of the first amount of charge associated with the external source.

Particular implementations may include one or more of the following features. Adjusting the amount of the current provided by the controllable current source may comprise providing a control signal to the controllable current source using a control setting circuit included in the integrator circuit. The control signal may be configured for controlling the controllable current source such that the amount of current provided by the controllable current source is adjusted. The control setting circuit may generate the control signal based on an indication of the measured difference at the output of the comparator and the sign of the measured difference at the output of the comparator.

The control setting circuit may be configured to use successive approximation to adjust the amount of current provided by the controllable current source such that the voltage at the first input of the comparator due to the external source may approach the reference voltage. A dynamic range or resolution of the measurement associated with the amount of current provided by the controllable current source may be controlled by digitally controlling the time step of the clock signal.

The details of one or more disclosed implementations are set forth in the accompanying drawings and the description below. Other features, aspects, and advantages will become apparent from the description, the drawings and the claims.

DETAILED DESCRIPTION

Typically, a traditional current integrator may consist of an operational amplifier (commonly known in abbreviated form as "op-amp") configured with a capacitive negative feedback. The two inputs of the op-amp may be considered as the two inputs of the integrator. The capacitance in the negative feedback may accumulate a charge that is proportional to the current that is sinked or sourced from the input of the integrator. In this context, "sinking" a current refers to drawing a current from the input of the integrator, while "sourcing" a current refers to providing a current to the input of the integrator.

When current is supplied to a capacitor, the capacitor stores the associated energy as charge. The amount of charge is proportional to the current supplied, and the time period for which the current is supplied. Similarly, the charge stored in a capacitor may be reduced by drawing a current from the capacitor. The relationship between the current supplied to or drawn from a capacitor, the charge associated with the capacitor, and the time period for which the current flows, is given by equation (1):

$$Q = I * t \quad (1)$$

In equation (1), Q is the total amount of charge that is added to or removed from a capacitor, I is the current that is supplied to or from the capacitor and t is the amount of time for which the current is supplied to or from the capacitor.

Referring back to the current integrator described previously, the charge accumulated by the capacitance in the negative feedback may create a voltage at the output of the integrator that is proportional to the charge accumulated and the size of the capacitance, which is illustrated by equation (2):

$$V_{INT} = (1/C_{INT}) * I * t \quad (2)$$

In equation (2), $V_{INT}$ is the voltage created at the output of the integrator, $C_{INT}$ is the capacitance across the op-amp connected in the negative feedback, I is the current provided to the integrator and t is the time for which the current is provided.

Integrators have several applications. Integrators may be used to integrate current or voltage. In addition, integrators may be used to measure capacitive sensors. For example, capacitive touch screen displays may be implemented using integrators configured for measuring capacitance.

As an example of another application, the capacitance of a circuit that is connected to an input of an integrator, which is referred to as self-capacitance, may be measured using the integrator. Self-capacitance of an input of the integrator may be measured by measuring the charge that is used to move the input voltage by a known amount dV (that is, change in voltage). This can be accomplished by changing the reference voltage REF at the second input of the integrator between known voltages, which causes the integrator to "regulate" the other input between the same voltages while also keeping track of the charges required to do so.

An integrator also may be used for measuring mutual capacitance. Generally, the goal of mutual capacitance measuring is it to measure coupling capacitance (referred to as $C_m$) between two wires. This may be measured by connecting one wire to the first input of the integrator and the other wire (typically referred to as X line) to a controllable voltage source. After the integrator is stable, the X line is pulsed, and a charge proportional to $C_m$ and the change in X line voltage is transferred to $C_{INT}$. The change in the voltage at the first input of the integrator due to charge being added is momentary and therefore does not affect the calculation.

In some implementations involving digital applications, the analog output from the integrator may need to be converted in to a digital result using, for example, an analog-to-digital converter (ADC) that is coupled to the integrator forming one unit. The accuracy and resolution of the digital result may depend on the accuracy and resolution of the ADC. In such implementations, the ADC may be a primary factor in determining the cost associated with the integration.

It may be useful to implement an integrator that performs efficient and accurate digital measurement of charge adjustments required to make the voltage of a circuit connected to the first input of the integrator same as the REF voltage that is connected to the second input of the integrator. Controlling the measurement digitally allows compensation and digital filtering to be used to lower the analog requirements, thereby reducing the cost. In addition, digital measurement removes the need for a dedicated ADC, which may lead to significant cost reduction and performance improvement.

In some implementations, such an integrator may be realized by digital circuits that use successive approximation integration for measuring a voltage at one input of the integrator, compared to a REF voltage at the other input of the integrator. Such an integrator may be known as a successive approximation integrator, also referred to by the acronym SAINT.

Figure 1:
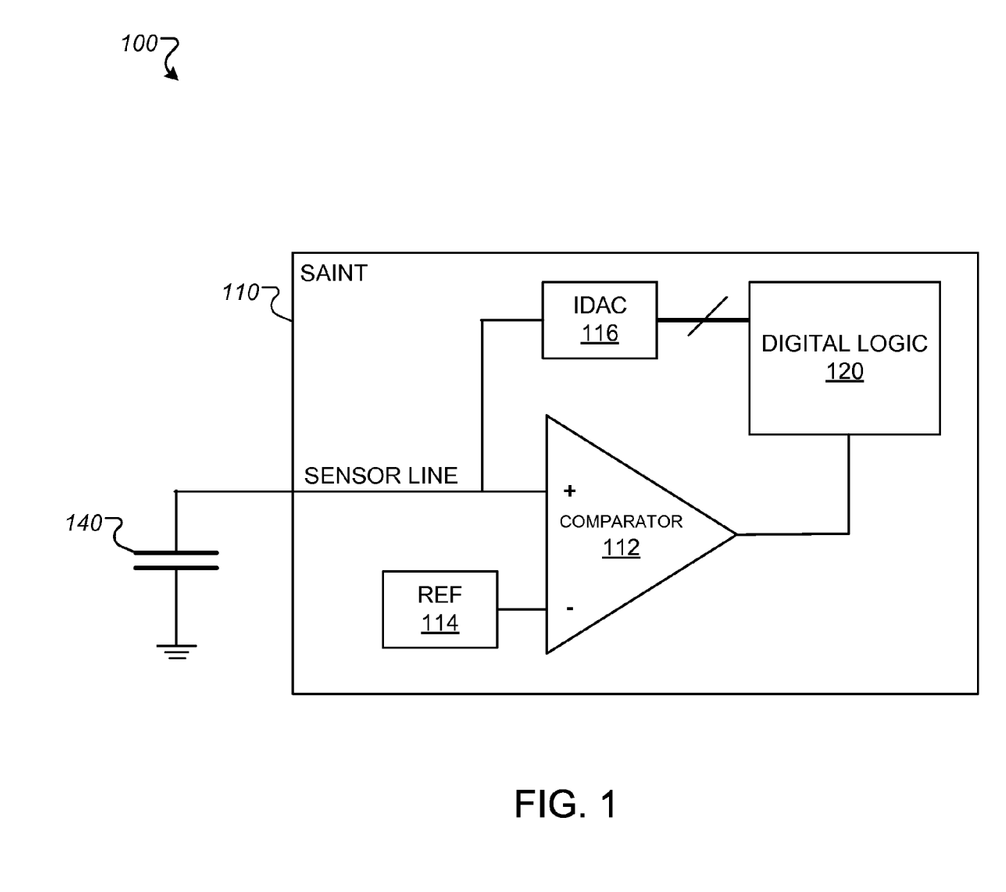
FIG. 1 is a conceptual block diagram of an exemplary circuit that may be used for successive approximation integration.

FIG. 1 is a conceptual block diagram of an exemplary circuit 100 that may be used for successive approximation integration. The circuit 100 includes a successive approximation integrator (SAINT) 110. Connected to an input of the SAINT 110 is a capacitive sensor 140, while a controllable voltage source 114 is connected to another input of the SAINT 110. The SAINT 110 includes a comparator 112, a controllable current source 116 and a digital logic circuit 120 that is configured for controlling the successive approximation mechanism.

The comparator 112, which has a positive input and a negative input, is configured for providing an output based on comparing two voltages that are connected to the two inputs. The output of the comparator may be a binary output. For example, the output of the comparator may be one of two predetermined voltage levels. One voltage level may indicate a '1' while the other voltage level may indicate a '0'. In one implementation, the comparator may output a '1' if the voltage at the positive input is higher than the voltage at the negative input, and may output a '0' otherwise. However, in other implementations, the output of the comparator may be the reverse of the above.

In some implementations, the controllable voltage source 114 may be included in the SAINT 110, while in other implementations the controllable voltage source 114 may be external to the SAINT 110. The controllable voltage source 114 is connected to an input of the comparator 112. The controllable voltage source 114 is configured for providing a reference voltage REF at the input of the comparator to which the voltage source is connected. In some implementations, the controllable voltage source 114 is connected to the negative input of the comparator 112. However, in other implementations, the controllable voltage source 114 may be connected to the positive input of the comparator 112.

In some implementations, instead of a controllable voltage source 114, a static reference voltage may be connected to an input of the comparator 112. In such implementations, the external circuit or sensor that is connected to the other input of the comparator 112 may be charged or discharged to a fixed voltage prior to integrating the input.

The controllable current source 116 may be a digital-to-analog converter with a current output (also known as IDAC). The controllable current source or IDAC 116 has an input that is connected to an output of the digital logic circuit 120, while an output of the IDAC 116 is coupled to the SENSOR_LINE at the input of the comparator 112 to which the SENSOR_LINE is connected, for example, the positive input of the comparator 112.

The IDAC 116 is configured for sinking or sourcing a current to/from the capacitive sensor 140. When the voltage at the positive input of the comparator 112 due to the capacitive sensor 140 and the charge added or stored in the sensor 140, is higher than the reference voltage REF at the negative input of the comparator 112 due to the controllable voltage source 114, the IDAC 116 sinks or draws current away from the capacitive sensor 140. This has the effect of reducing the voltage at the positive input of the comparator 112 due to the capacitive sensor 140, such that the voltage at the positive input of the comparator 112 approaches the REF voltage. Conversely, when the voltage at the positive input of the comparator 112 due to the capacitive sensor 140 and the charge added or stored in the sensor 140, is lower than the REF voltage, the IDAC 116 sources or provides current to the capacitive sensor 140, which has the effect of increasing the voltage at the positive input of the comparator 112, such that the voltage at the positive input of the comparator 112 approaches the REF voltage.

The digital logic circuit 120 is configured for controlling the current output of the IDAC 116 such that the voltage at the positive input of the comparator 112 is regulated. The voltage at the positive input of the comparator 112 (which is same as the voltage on the SENSOR LINE that connects the capacitive sensor 140 to the positive input of the comparator 112) is regulated to the voltage on the negative input of the comparator 112. This voltage is based on the voltage due to the capacitive sensor 140, parasitic capacitance on the SENSOR LINE, and charges present on the capacitor plates and the electrical wires.

In one implementation, the digital logic circuit 120 regulates the voltage on the SENSOR LINE such that the voltage at the positive input of the comparator 112 is same as the REF voltage. The digital logic circuit 120 performs this voltage regulation by sinking or sourcing progressively smaller amounts of current to the capacitive sensor 140 using the IDAC 116.

The digital logic circuit 120 may compute the total amount of charge that is added to, or removed from, the capacitive sensor 140 due to the current from the IDAC 116 that is supplied for regulating the voltage on the SENSOR LINE. The total amount of charge may be computed by determining the amount of time for which a known amount of current is supplied to or from the capacitive sensor 140, using equation (1).

The capacitive sensor 140 represents an external circuit that provides a capacitive load or coupling to ground (or some other common reference) at one input of the integrator to which it is connected. The capacitive sensor is also referred to interchangeably as a sensor or a capacitor.

Therefore, as described in the preceding section, the circuit 100 performs voltage regulation by sinking or sourcing progressively smaller amounts of current in successive iterations such that the SENSOR LINE voltage approximates the REF voltage. By performing voltage regulation in this manner, the circuit 100 may be used for measuring an amount of charge associated with the voltage regulation. The circuit 100 is hence referred to as a successive approximation integrator or SAINT. The implementation of a successive approximation integrator is described in greater detail in the following sections.

Figure 2:
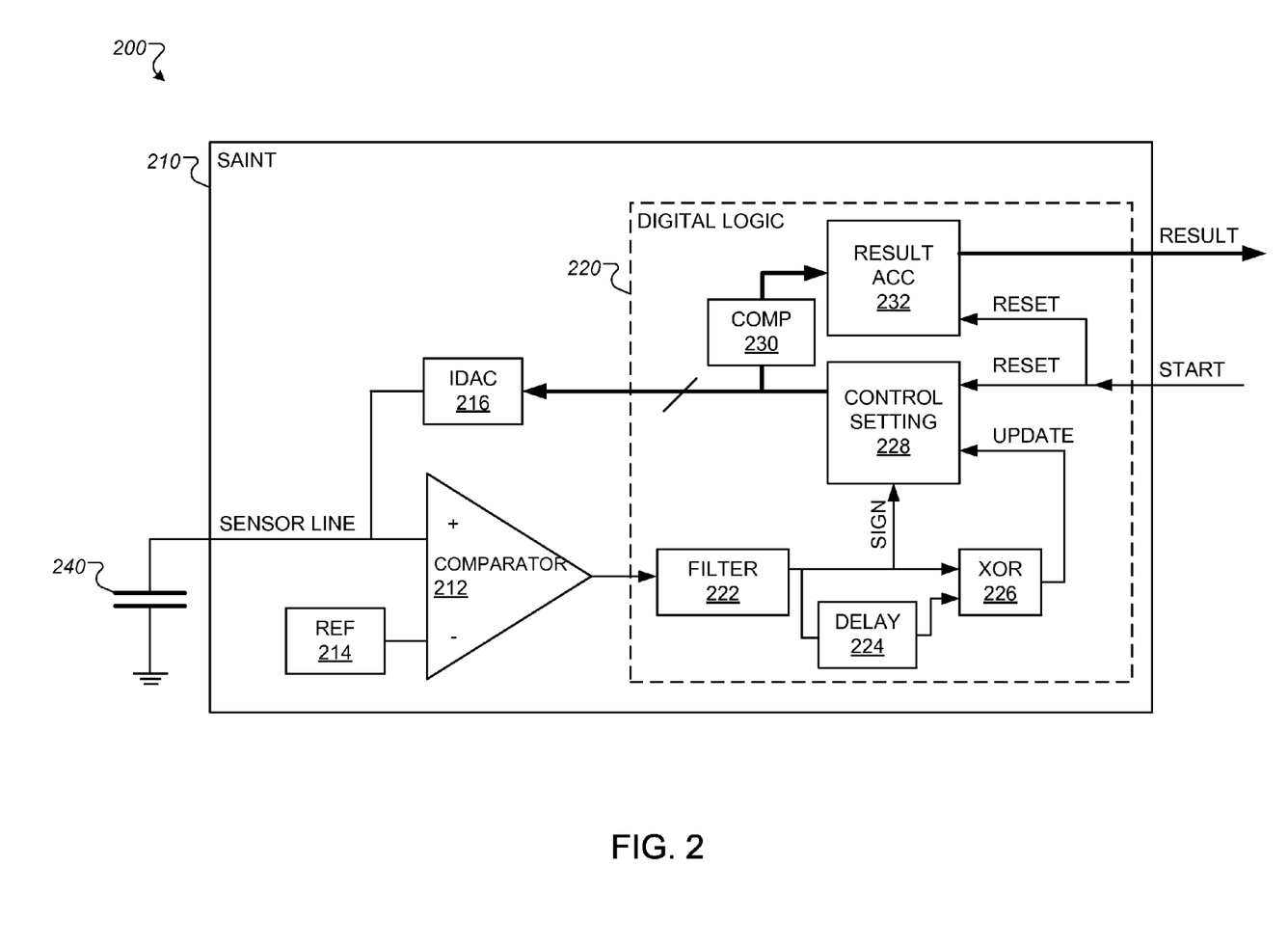
FIG. 2 is a conceptual block diagram of an exemplary circuit that may be used for implementing successive approximation integration.

FIG. 2 is a conceptual block diagram of an exemplary circuit 200 that may be used for implementing successive approximation integration. For example, the circuit 200 may be used for the successive approximation integration described with reference to circuit 100.

The circuit 200 includes a successive approximation integrator (SAINT) 210 and an external capacitor 240 that is connected to an input of the SAINT 210. Connected to another input of the SAINT 210 is a controllable voltage source 214. The SAINT 210 includes a comparator 212, a controllable current source 216 and a digital logic circuit 220.

The external capacitor 240 represents an external circuit that is being measured using the SAINT 210. The external capacitor 240 is similar to the capacitive sensor 140. The external capacitor 240 with a stored charge provides a voltage at the input of the SAINT 210 to which the external capacitor is connected. The external capacitor 240 is also referred to interchangeably as a capacitive sensor 240, or as sensor 240.

The digital logic circuit 220 may be an exemplary implementation of the digital logic circuit 120. The digital logic circuit 220 includes a filter 222, which is connected to a delay circuit 224 and an XOR logic circuit 226. In addition, the digital logic circuit 220 includes a control setting circuit 228, a compensation circuit 230 and an accumulator circuit 232.

The comparator 212 is similar to the comparator 112. The comparator 212 has a positive input and a negative input and it is configured for providing an output based on comparing two voltages that are connected to the two inputs. The external capacitor 214 is connected to the SAINT 210 at the positive input of the comparator 212. The controllable voltage source 214 is connected to the negative input of the comparator 212.

The controllable voltage source 214, which is similar to the controllable voltage source 114, is configured for providing a reference voltage REF. While FIG. 2 shows the controllable voltage source 214 connected to the negative input of the comparator 212, in some implementations, the controllable voltage source 214 may be connected to the positive input of the comparator 212.

The controllable current source 216, which may be similar to the controllable current source 116, includes an IDAC. The controllable current source or IDAC 216 has an input that is connected to the digital logic circuit 220, while the output of the IDAC 216 is coupled to the external capacitor 240 at the positive input of the comparator 212. The IDAC 216 is configured for sinking or sourcing a current from the capacitor 240 so that the SENSOR LINE voltage at the positive input of the comparator 212 due to the capacitor 240 is same as the reference voltage REF at the negative input of the comparator 212.

The filter 222 in the digital logic circuit 220 is connected to the output of the comparator 212. The filter 222 is a digital filter that is configured for providing at its output a filtered version of the comparator 212 output. In some implementations, the filter 222 may be a time hysteresis based filter. However, in other implementations, the filter 222 may be some other type of digital filter.

The delay circuit 224 is coupled to the output of the filter 222. The delay circuit 224 is configured for providing, at its output, a time-delayed version of its input. The amount of delay may be pre-configured at the time of implementation of the digital logic circuit 220. Therefore, the delay circuit 224 provides at its output a delayed version of the digital signal provided by the filter 222.

The XOR logic circuit 226 has two inputs—one input is coupled to the output of the filter 222, while the second input is coupled to the output of the delay circuit 224. The XOR logic circuit 226 is configured to compare the digital signal provided by the filter 222 with the delayed version of the digital signal provided by the delay circuit 224.

When the SENSOR LINE voltage crosses the REF voltage, that is, either exceeds or goes below the REF voltage, due to the addition or removal of current by the IDAC 216, the comparator 212 output changes and hence the digital signal provided by the filter 222 changes. Therefore, the signal provided to the second input of the XOR logic circuit 226 by the delay circuit 224 becomes different from the digital signal provided by the filter 222 at the first input of the XOR logic circuit. Consequently, the XOR logic circuit 226 generates a pulse at its output, since the two input signals differ from one another. The pulse at the output of the XOR logic circuit 226, which is denoted by the UPDATE signal in FIG. 2, indicates that the amount of charge that has been added to or removed from the external capacitor 240 by the IDAC 216 current is more than the amount needed to make the SENSOR LINE voltage same as the REF voltage.

The control setting circuit 228 receives the UPDATE signal through an input that is coupled to the output of the XOR circuit 226. In addition, the control setting circuit 228 has an input connected to the output of the digital filter 222 for receiving the SIGN signal from the digital filter 222. The control setting circuit 228 also receives a RESET signal based on a START signal that is input to the integrator 210.

The control setting circuit 228 is configured for controlling the active current configuration of the IDAC 216. Upon receiving the UPDATE signal, control setting circuit 228 controls the IDAC 216 such that the amount of current provided to, or removed from, the capacitor 240 is reduced by a pre-determined factor. In addition, the sign of the current is changed, that is, the direction of the current is reversed. Therefore, if the IDAC 216 was previously providing current to the capacitor 240, the control signal from the control setting circuit 228 configures the IDAC 216 such that the IDAC 216 now draws current from the capacitor 240, and vice versa. By reducing the amount of current provided to the capacitor 240 and changing the direction of the current, the integrator 210 is able to find successively more accurate results such that the SENSOR LINE voltage approaches the REF voltage with greater accuracy.

The compensation circuit 230 is coupled to the output of the control setting circuit 228. The compensation circuit 230 reads the control signal from the control setting circuit 228 to the IDAC 216 such that the compensation circuit 230 is able to determine the settings for the IDAC 216, that is, amount of current that is to be supplied to or from the capacitor 240 by the IDAC 216. In addition, the compensation circuit 230 determines the time period for which the current is to be supplied to or from the capacitor 240. Based on determining the current and the time period, the compensation circuit 230 may compute the amount of charge that is sinked or sourced from the capacitor 240 due to the control signal from the control setting circuit 228.

In some implementations, upon determining the IDAC 216 setting, the compensation circuit 230 may perform compensation on the IDAC settings using a digital lookup table. The compensation circuit 230 provides information on the amount of charge sinked or sourced from the capacitor 240, either compensated or otherwise, to the accumulator circuit 232.

The accumulator circuit 232 is configured for providing at its output a result signal, denoted by RESULT in FIG. 2, which indicates a digital value proportional to the amount of charge sinked or sourced from the external capacitor 240 such that the SENSOR LINE voltage is same as the REF voltage. During the measurement process, the accumulator circuit 232 stores the amount of charge internally based on the information received from the compensation circuit 230 in successive iterations of the measurement sequence.

In some implementations, the compensation circuit 230 may not be present. In such implementations, the accumulator circuit 232 is directly coupled to the output of the control setting circuit 228 and reads the control signal sent from the control setting circuit 228 to the IDAC 216 in each iteration. From the control signal, the accumulator circuit 232 is able to determine the amount of charge that is sinked or sourced from the capacitor 240 in the respective iteration, in a manner similar to that described previously with reference to the compensation circuit 230.

Using the digital circuit 220 as described in the preceding section, the integrator 210 measures a delta charge, that is, a change in the charge at the external capacitor 240 that is added by some external event. The delta charge introduces a change in voltage at the SENSOR LINE, as described by the relation dV=dQ/C, where dV is the change in input voltage caused by the change in charge dQ and C is the capacitance of the input line (which is assumed to be constant). Therefore, to regulate the SENSOR LINE voltage back to the voltage it had (that is, the REF voltage) before the unknown charge was introduced, the integrator 210 removes the same amount of charge as was introduced by the external event. While regulating the voltage back to the REF voltage, the integrator digitally keeps track of the charges used to do so. The integrator 210 regulates the SENSOR LINE voltage to the REF voltage by successively adding or removing, or both, exponentially smaller and smaller charges using the IDAC 216 current, until the SENSOR LINE voltage is equal to the REF voltage. As indicated by equation (1), charge may be added or removed by controlling the amount of current and the time for which the current is added or removed.

The accumulator circuit 232 receives, from the compensation circuit 230, a digital value proportional to the charge added or removed from the capacitor 240 in each iteration of the measurement sequence, or alternatively, determines the charge added or removed by reading the control signal from the control setting circuit 228, and updates the charge stored based on the charge added or removed in the present iteration of the measurement sequence. When the SENSOR LINE voltage is same as the REF voltage, the value of the RESULT signal at the output of the accumulator circuit 232 is proportional to the charge that is used to make the voltage on the positive input (SENSOR_LINE) same as the voltage on negative input.

The RESULT signal is most accurate when the minimum setting of the IDAC 216 and the minimum time step, which is described in the following sections, are reached and a new update is signaled (for example, by a change in the sign of the comparator 212 output). For further iterations of the measurement sequence after this point, the integrator 210 continues to oscillate between plus and minus the minimum setting of the IDAC 216, until a new measurement is triggered. At this stage, the charge measurement may be considered completed.

When a new charge measurement is to be conducted, the START signal may be used to trigger a reset of the control setting circuit 228 and the accumulator circuit 232. The START signal provides a RESET trigger to the control setting circuit 228, which resets the control setting circuit 228 to plus or minus the maximum setting for the IDAC 216, depending on the sign of the active output from the filter circuit 222. The sign of the active output of the filter circuit 222 is input to the control setting circuit 228 as denoted by the SIGN signal. In addition, the START signal provides a RESET trigger to the accumulator circuit 232, which clears the value that was previously accumulated in the accumulator circuit 232 from the previous measurement. In some implementations, there is a finite time interval between successive measurements such that a charge transfer from a previous measurement is completed so that the SIGN signal is settled correctly.

Figure 3:
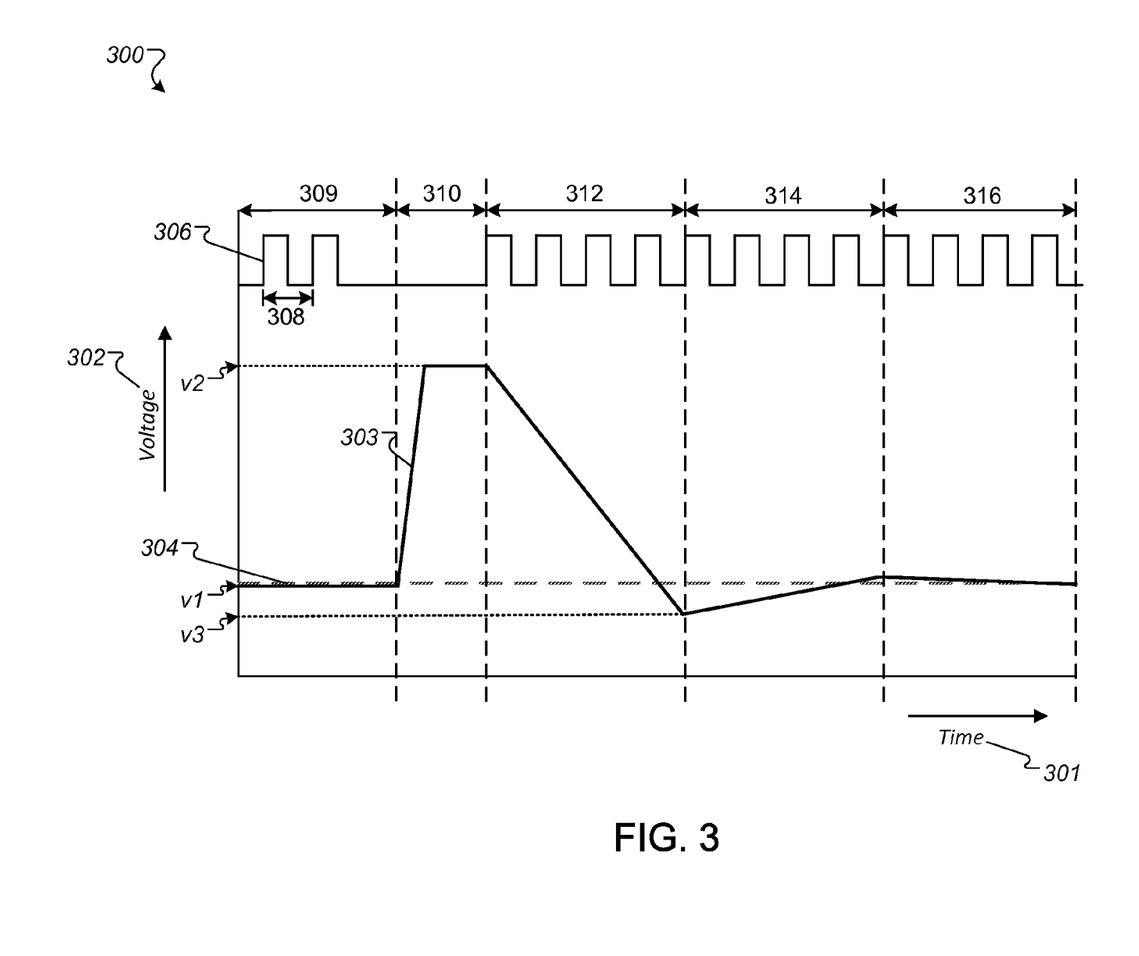
FIG. 3 is a graph illustrating an exemplary measurement sequence using a successive approximation integrator.

FIG. 3 is a graph 300 illustrating an exemplary measurement sequence using a successive approximation integrator. The measurement plotted in graph 300 may be implemented using the circuit 200, as described in the following section. However, the measurement plotted in graph 300 may be implemented by other circuits or system configurations.

The X-axis 301 of graph 300 plots time while the Y-axis 302 plots voltage. The curve 303 corresponds to the SENSOR_LINE voltage. The curve 304 corresponds to the REF voltage. 306 indicates a sample clock provided to the integrator 210, with a time step 308. Different time intervals are indicated by 309, 310, 312, 314 and 316. Each of the time intervals 312, 314 and 316 correspond to a different iteration of the measurement process.

The measurement sequence plotted in graph 300 is based on ideal components and no noise. Noise and static errors, for example comparator offset and propagation delay, may affect absolute values and measurement time. Typically, only relative measurements are needed, but absolute measurements may be supported by calibration. Noise and propagation delay may cause the iterations to be longer or shorter than ideal such that the convergence time may be different. However, the total number of iterations for charge added or removed typically will not be affected by such factors.

Initially, before the charge measurement is commenced, the SENSOR LINE voltage may be equal to the REF voltage. This is indicated in the graph 300 during the initial time interval 309, when the curve 303 approximately overlaps the curve 304 at a voltage value of v1, indicating that the SENSOR LINE voltage is almost equal to the REF voltage, which is given by v1 in the graph 300.

Before the measurement is started, a charge is added to the capacitor 240, which may increase the SENSOR LINE voltage by a fixed amount. This is indicated in the graph 300 during the time interval 310, when the curve 303 moves from voltage level v1 to voltage level v2 that is higher than v1. The difference in voltage between v1 and v2 depends on the amount of charge added and the value of the capacitance, including parasitic capacitance, connected to the SENSOR LINE. Charge may be added to the capacitor 240 by some current source that is external to the SAINT 210, or due to a change in voltage on a node connected to SENSOR_LINE through a second capacitor (mutual measurement). In some implementations, the SENSOR LINE voltage may not increase when a charge is added to the capacitor 240.

After the charge addition during time interval 310, the measurement is performed using the integrator. The measurement is started by performing a linear search towards the REF voltage, starting from the maximum setting of the IDAC 216. During the first iteration, due to the maximum amount of current sinked or sourced from the capacitor 240, the SENSOR LINE voltage may cross the REF voltage. The first iteration is indicated in the graph 300 by time interval 312, when the curve 303 moves from voltage level v2 to voltage level v3 that is lower than v1.

When the SENSOR LINE voltage and REF voltage cross, the result for the current iteration is ready. The result may correspond to the value accumulated in the accumulator circuit 232, and may be provided as the RESULT signal at the output of the integrator 210. The result may include an error that has a value proportional to the product of the current IDAC 216 setting and time step 308.

In some implementations, in order to improve the accuracy of the result, the measurement sequence may be continued. In the next iteration, the control setting circuit 228 may update the IDAC 216 setting. In the updated IDAC 216 setting, the amount of current to or from the capacitor 240 is reduced, and the direction of the current is reversed. Alternatively, or in addition to the amount and direction of current, the time interval for which the current is provided to the capacitor 240 may be reduced. When the SENSOR LINE voltage crosses REF voltage again, the accuracy of the result is proportional to the new setting of the IDAC 216 and the time step. This is indicated in the graph 300 during the iteration corresponding to time interval 314, when the curve 303 moves from voltage level v3 to a voltage level that is slightly higher than REF voltage level v1.

The measurement sequence may be continued for further iterations until the minimum IDAC 216 setting and minimum time step are reached. This may allow the integrator to improve the accuracy of the result in successive iterations. When the minimum setting of the IDAC 216 and time step is reached, the SENSOR LINE voltage and the REF voltage are approximately the same. This is indicated in the graph 300 for the iteration corresponding to time interval 316, when the curve 303 approaches the REF voltage level v1. This was the initial state during interval 309 before charge was added to the capacitor 240. By starting and ending at approximately the same SENSOR LINE voltage, all charges initially introduced travels through SAINT. This makes the result invariant to the size of capacitance on the SENSOR LINE, and only to the charge added or removed.

In some implementations, full accuracy may not be important, or the performance of the integrator (that is, the speed of measurement) may be more important than full accuracy. In such implementations, the measurement sequence may terminate before either the minimum IDAC 216 setting, or the minimum time step, or both, are reached.

A high accuracy in the measurement may be accomplished by successively switching the IDAC 216 setting to new current values that are approximately smaller by a factor of N (where N is a positive integer) than the value of the amount of current supplied to or removed from the capacitor 240 in a previous iteration. By adding or removing exponentially smaller and smaller charges, the voltage (on the positive input) may converge to a value close to the REF voltage in logarithmic time, which is described by equation (3):

$$MAX = N * \log_N(\text{codes}) * \text{time\_step}$$

$$MIN = 1 * \log_N(\text{codes}) * \text{time\_step}$$

$$TYP = (MAX+MIN)/2 \quad (3)$$

In equation (3), MAX, MIN and TYP are time values that are computed using time_step as time unit. Code corresponds to the resolution of the RESULT signal, which is determined by the number of bits that are used for the RESULT signal.

For example, in a noiseless environment using ideal components, for a 10 bit result ($2^{10}$=1024 codes) using a successive approximation factor of N={2,10,1024} requires {$\log_2(1024)$=10, $\log_{10}(1024)$=3 and $\log_{1024}(1024)$=1} iterations and a maximum of {2,10 and 1024} steps per iteration respectively, before the SENSOR LINE voltage crosses the REF voltage. The minimum number of steps per iteration is 1.

TABLE 1

|  | N = 2 | N = 10 | N = 1024 |
| --- | --- | --- | --- |
| MAX | 20.0 | 30.0 | 1024.0 |
| MIN | 10.0 | 3.0 | 1.0 |
| TYP | 15.0 | 16.5 | 512.5 |

Table 1 provides an example of convergence time for the result of a measurement sequence, in time_step units (time_step=1). In table 1, MAX, MIN and TYP indicate maximum, minimum and typical number of total time steps.

Table 1 indicates that with 3 different settings for the amount of current provided by the IDAC 216 (N=10), the charge may be measured, with 10 bit resolution, in 16.5 time steps on average. In comparison, a linear search may perform a measurement in 515.5 time steps on average. In some implementations, the successive approximation factor N may be different in different iteration phases.

The resolution of the result by the integrator 210 depends on how small the value of charge may be that is added or removed from the capacitance of SENSOR LINE. Since charge is the product of the amount of current and the time interval for providing the amount of current, the resolution may be increased by decreasing the amount of current or the corresponding time step. In a typical digital synchronous system, time may usually be controlled with very high accuracy and dynamic range, so increasing the dynamic range of the measurement by increasing the charge integration time may be readily achieved. For example, a 1-bit IDAC 216 and a very accurate digital clock can produce an integration result with an accuracy of many bits.

For high-accuracy charge measurement with an IDAC of more than 1 bit, the maximum IDAC setting must be accurate enough compared to the minimum setting of the IDAC such that errors above 1 least-significant bit (LSB) are not introduced when multiple maximum settings are accumulated. This may be achieved with digital compensation, for example, using the compensation circuit 230.

The measurement sequence described with reference to FIG. 3, and the corresponding charge accumulation using accumulator circuit 232, may be performed in a fully digital system. This may allow digital compensation to be applied to improve the integral non-linearity (INL), that is, non-linearity associated with the IDAC 216, for all or some settings of the IDAC 216, or to improve accuracy for the maximum setting of the IDAC to support the example described in the preceding section.

The INL represents an error associated with a DAC, for example the IDAC 216. The INL quantifies the degree of linearity of the DAC. For example, the IDAC 216 may be configured to provide 10 bit resolution. However, due to INL errors, the resolution may be good for 7 bits, that is, 3 bits of accuracy may be lost. INL errors may be fixed by making the design of the IDAC 216 more robust, but this solution may be expensive and time consuming. Therefore, it may be preferable to fix INL problems digitally, for example by calibrating the DAC. For instance, if the IDAC output values are known to be 10% high in the middle region, the output can be compensated by subtracting 10% on the input. Alternatively, 10% may be subtracted from the digitally accumulated values when the IDAC is in the middle region, for example using the compensation circuit 230.

However, the INL error may not be confined to any particular region. The relevant error may be very different from code to code. A 10 bit IDAC may have 1024 "regions" or codes, so it may be expensive to calibrate and remember compensation values for each code. By using successive approximation, for example as in SAINT 210, the full range of the IDAC may not be utilized, and therefore it may be considerably less expensive for the SAINT 210 to compensate for INL errors. For example, using a successive approximation factor of 10 for a 10 bit IDAC, 3 different settings of the available 1024 may be implemented to obtain full 10 bit resolution and accuracy. Calibrating and storing calibration data for 3 IDAC settings is relatively inexpensive.

As shown by equation (3), typically the number of settings of the IDAC 216 is logarithmic to the number of bits in the result. Therefore, the number of settings for compensation may be low, and hence it may be cost-effective to implement digital compensation. Compensation may be applied by accumulating the compensated value, that is, the output of the compensation circuit 230, for the given IDAC 216 setting, instead of accumulating the IDAC 216 setting directly.

As explained previously, a 10 bit IDAC may provide 7 bit accuracy due to INL errors. In such circumstances, the IDAC may have 7 effective number of bits (ENOB). Therefore, compensating for INL errors as described previously may increase the ENOB of the IDAC 216. The digital compensation for INL errors also may enable design of analog components with lower ENOB than the target value and then rely on digital correction to reach the target ENOB. This may be more cost effective than analog correction.

The INL may be compensated to an arbitrary ENOB, in which the accuracy is greater than the number of bits natively supported by the IDAC 216. This may be possible because compensation is implemented on the digitally accumulated value, instead of directly on the IDAC 216 setting. This may enable the integrator 210 to reach an accuracy that allows the maximum setting of the IDAC 216 to be applied more than other settings to improve the dynamic range without reducing accuracy, thus improving overall measurement performance.

The compensation values may be found by calibration. In some implementations, the calibrating system may be as accurate as the required ENOB. However, in other implementations, the accuracy of the calibrating system may be different.

In some implementations, the calibrating system may be external to the integrator 210. In such implementations, the calibration may be performed during production of the integrator 210.

In other implementations, the calibrating system may be internal to the integrator 210, and the calibration may be performed at runtime without increasing the cost too much. For example, by reducing the requirement on performance it is possible to design a very low cost and very accurate reference IDAC. The reference IDAC can be used to calibrate the main IDAC 216, which may be much faster, but more inaccurate, compared to the low cost IDAC. This may be accomplished by temporarily connecting the two IDACs together and configuring the reference IDAC to the corresponding inverse setting of the main IDAC and then tune the reference IDAC until the average output neither sinks nor sources any current. This value represents the calibrated value of the active main IDAC setting.

A low cost reference IDAC may be realized with one current source that is pulse width modulation (PWM)-controlled using digital logic and a very accurate digital clock. Alternatively, the low cost IDAC may be realized based on delta-sigma DACs. In general, an internal calibrating system may allow time to be traded for accuracy and cost, which may be a good fit for calibration circuits.

The digital integrator 210 may provide greater noise immunity compared to analog integrators. Since the charge accumulation is performed digitally, this enables digital filters to be used directly on the input signal that is accumulated. In addition to being cost-effective, this may provide better signal quality as digital filters can be made more advanced and flexible than analog filters.

The input of the comparator 212 to which the SENSOR LINE is connected may have a high value of impedance and the SENSOR LINE may be sampled at a fixed clock frequency. This may make the integrator 210 more resistant to spot noise than traditional analog integrators coupled with ADC systems. For example, a traditional continuous time analog integrator may have low impedance, and may easily saturate if spot noise or current surge (due to coupling) is received at any time during integration. Saturating the integrator may lead to an inaccurate measurement. On the other hand, due to the high impedance and sampled nature of the integrator 210, spot noise may affect the measurement only if the spot noise appears consistently and at the exact same time as the sample clock.

Figure 4A:
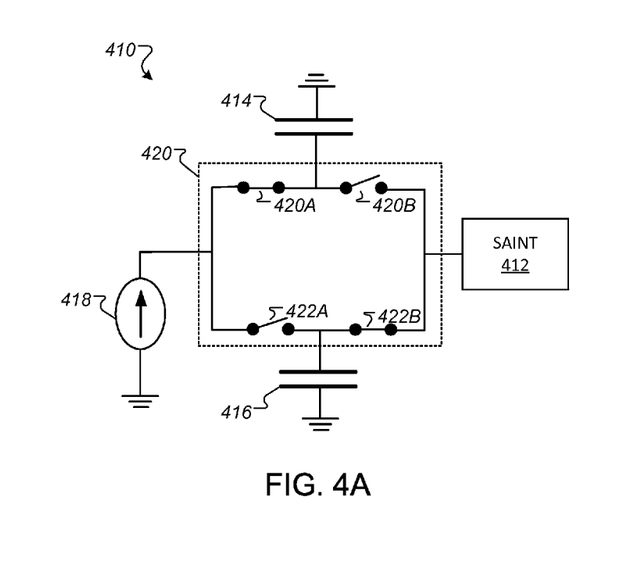
FIGS. 4A-4C are conceptual block diagrams of exemplary measurement circuits in which a successive approximation integrator may be applied.
Figure 4B:
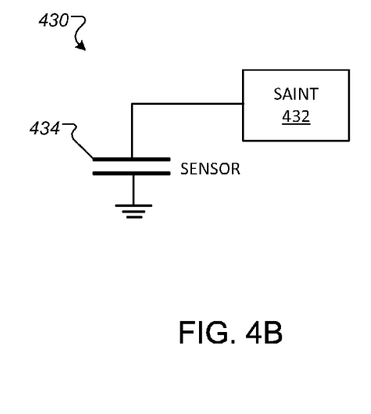
Figure 4C:
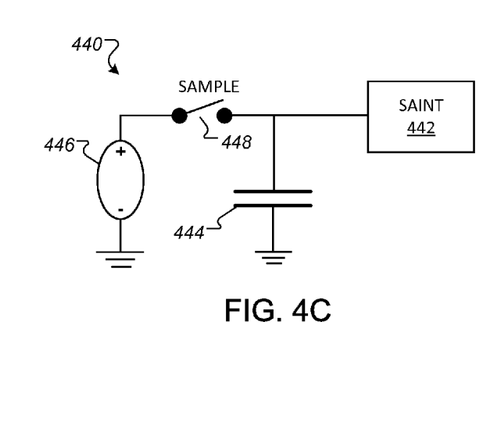

FIGS. 4A-4C are conceptual block diagrams of exemplary measurement circuits 410, 430 and 440 respectively, in which a successive approximation integrator may be applied. The measurement circuits 410, 430 and 440 may be realized using a SAINT, for example the integrator 210 of circuit 200. The following describes the measurement circuits 410, 430 and 440 as applications of the integrator 210. However, the measurement circuits 410, 430 and 440 also may be implemented using other devices or system configurations.

FIG. 4A illustrates an exemplary circuit 410 that may be used for current integration. The circuit 410 includes an integrator 412 that is coupled to capacitive sensors 414 and 416 through a switching circuit 420. The integrator 412 may be similar to the integrator 210. A current source 418 is also coupled to the capacitive sensors 414 and 416 through the switching circuit 420. The other plate of each capacitive sensor 414 and 416 is grounded. The switching circuit 420 includes switches 420A-420B and 422A-422B.

A current may be measured by the circuit 410 by periodically charging a capacitive sensor for a fixed sample time. Then the current source is disconnected from the sample capacitive sensor and an integrator is used to measure the charge added to the capacitive sensor by the current. The current to measure is proportional to (charge measured)/(time measured).

For example, the current source 418 may be used to charge the capacitive sensor 414 for a fixed sample time. When the capacitive sensor 414 is being charged, the switch 420A is closed and the switch 420B is open, as shown. Once the charging is completed, the current source 418 is disconnected by opening the switch 420A. The integrator 412 is connected by closing the switch 420B and the charge added by the current source 418 is measured.

If another capacitive sensor is added to the circuit 410, one capacitive sensor may be charged while the other one is being measured, such that no information is lost. For example, as shown in FIG. 4A, since switch 420A is closed while switch 422A is open, the current source 418 is connected to the capacitive sensor 414, but disconnected from the capacitive sensor 416. On the other hand, since switch 420B is open but switch 422B is closed, the integrator 412 is disconnected from capacitive sensor 414 but is connected to capacitive sensor 416. Therefore, while capacitive sensor 414 is being charged by the current source 418, the charge added to capacitive sensor 416 may be measured by the integrator 412. The capacitive sensor being charged and the capacitive sensor being measured may be reversed by reversing the configuration of the switches.

Repeating the above sequence may allow the current to be continuously monitored. This may allow the current from current source 418 to be measured by digitally accumulating the measured currents using the integrator 412. The monitored current also may be integrated by not resetting the internal accumulator when switching between the connected capacitors.

FIG. 4B illustrates an exemplary circuit 430 that may be used for capacitance measurement. The circuit 430 includes an integrator 432 that is coupled to a capacitive sensor 434. The other plate of the capacitive sensor 434 is grounded. The circuit 430 is similar to the circuit 200, the integrator 432 may be similar to the integrator 210, and the capacitive sensor 434 may be similar to the capacitive sensor 240. The coupling between the integrator 432 and the capacitive sensor 434 may be similar to the SENSOR LINE.

As described previously, the self-capacitance of the capacitive sensor 434 may be measured by keeping track of the charge that is used to regulate the voltage on the SENSOR LINE from a first known voltage to a different second known voltage. The capacitance is then C=dQ/dV, where dQ is the change in charge (measured by the integrator) and dV is the difference between the first known voltage and the second known voltage (where the latter is usually implemented using a VDAC as the REF voltage (214)). In addition to the self-capacitance of capacitive sensor 434, the measurement may include the capacitance due to other factors on the SENSOR LINE, for example parasitic capacitances.

The circuit 430 also may be used for measuring mutual capacitance. For example, this may be achieved by starting the integrator 432 every time a new charge is introduced to the self-capacitance of the SENSOR LINE.

FIG. 4C illustrates an exemplary circuit 440 that may be used for voltage measurement. The circuit 440 includes an integrator 442 that is coupled to a capacitive sensor 444, whose other plate is grounded. The integrator 442 and the capacitive sensor 444 are also coupled to a voltage source 446 through a switch 448. The integrator 442 may be similar to the integrator 210.

The capacitive sensor 444 may be charged by the voltage source 446 when the voltage source 446 is connected to the capacitive sensor 444 by closing the switch 448. The capacitive sensor 444 may be charged for a fixed amount of time and then the voltage source may be disconnected from the capacitive sensor 444 by opening the switch 448.

Once the voltage source 446 is disconnected from the capacitive sensor 444, the integrator 442 may be used to measure the charge needed to regulate the voltage on the connection between the integrator 442 and the capacitive sensor 444 back to a reference voltage. The mechanism for regulating the voltage back to the reference voltage (for example, the REF voltage) may be similar to the mechanism described with reference to circuit 200.

The measured charge is proportional to the voltage difference and the capacitance of the capacitive sensor 444. The latter is constant, and therefore the measured charge will vary proportionally to the sampled voltage.

Since the voltage measurement described above may be performed digitally by using a SAINT as the integrator 442, the results are available digitally, without needing a dedicated ADC. Therefore, the circuit 440, including a successive approximation integrator 442, may be used as a general purpose ADC.

Figure 5:
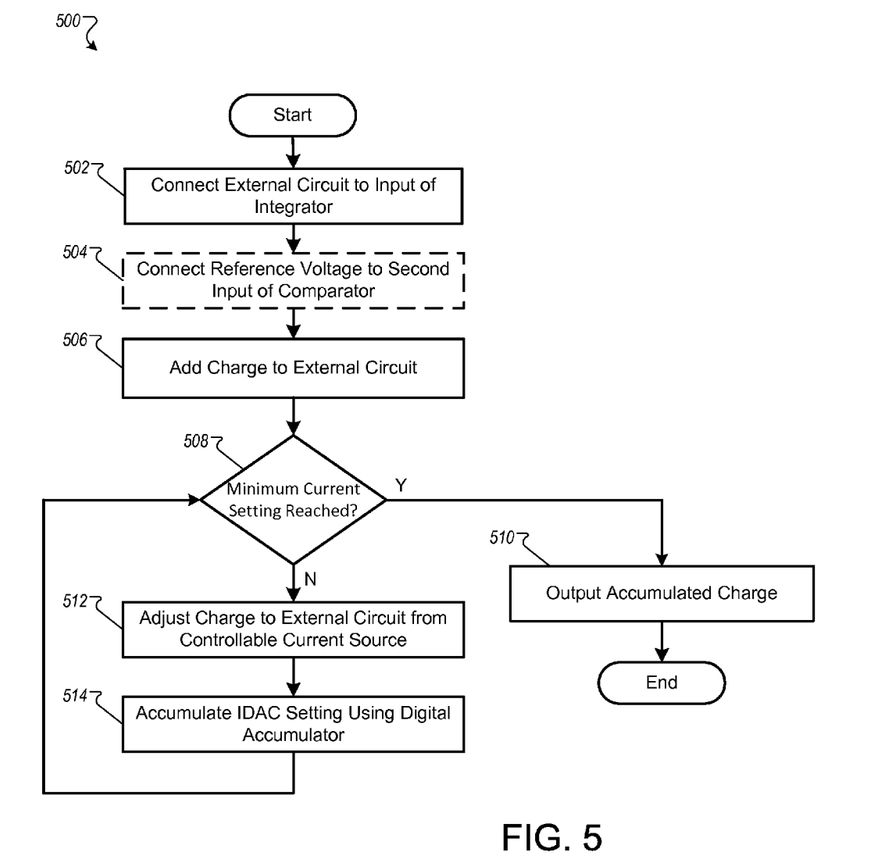
FIG. 5 is a flow chart illustrating an exemplary process for charge measurement using a successive approximation integrator.

FIG. 5 is a flow chart illustrating an exemplary process 500 for charge measurement using a successive approximation integrator. The process 500 may be performed by a circuit that implements a successive approximation integrator. For example, the process 500 may be performed for measuring the charge of the capacitive sensor 240 using the integrator 210 in the circuit 200. The following describes the process 500 as being performed by components of the circuit 200. However, the process 500 may be performed by other circuits, systems or system configurations.

In order to perform charge measurement of an external circuit, the external circuit is connected to an input of the integrator (502). For example, the capacitive sensor 240 is connected to the positive input of the comparator 212 included in the SAINT 210.

In some implementations, a reference voltage source is connected to the second input of the comparator (504), which is included in the integrator. However, in other implementations, the reference voltage source already may be included in the integrator and connected to the comparator. The dotted line in (504) indicates such implementations. For example, in the SAINT 210, the reference voltage source that provides the REF voltage is connected to the negative input of the comparator 212.

Charge is added to the external circuit (506). For example, an external current source may be used to make an initial charge transfer to the capacitive sensor 240 before the measurement sequence is started, as illustrated in interval 310 of the graph 300.

The measurement sequence starts after the initial charge transfer. In the first iteration of the sequence, a maximum amount of charge is added to or removed from the capacitive sensor 240 based on the maximum current setting of the IDAC 216. Whether charge is added or removed is determined based on the output of the comparator 212. Upon comparing the SENSOR LINE voltage to the REF voltage, the comparator 212 provides an output indicating whether the SENSOR LINE voltage is greater or lower than the REF voltage.

It is determined whether the minimum current setting is reached (508). For example, during the measurement sequence, charge is added to or removed from the capacitive sensor 240 in each iteration in successively smaller amounts based on successive settings of the IDAC 216 and the time steps. At each stage, the control setting circuit 228 checks whether the minimum current setting of the IDAC 216 is reached.

If the minimum current setting of the IDAC 216 is reached, the SENSOR LINE voltage approximates as closely as is possible the REF voltage, based on the configuration and limitations of the integrator 210. Any further charge added to or removed from the capacitive sensor 240 will make the SENSOR LINE voltage oscillate along the REF voltage. At this stage, the value accumulated by the integrator corresponds to the charge initially added to the external circuit. Therefore, the accumulated value is output (510). For example, the integrator 210 outputs the value accumulated by the digital accumulator circuit 232 as the RESULT signal, which provides a measure of the charge originally present in the capacitive sensor 240.

On the other hand, if the control setting circuit 228 determines that the minimum current setting of the IDAC 216 is not reached, then further charge adjustments for the external circuit are possible in order to make the voltage due to the external circuit approach the reference voltage. Therefore, the charge to the external circuit from the controllable current source is adjusted (512). For example, at the next iteration of the measurement sequence, the control setting circuit 228 controls the IDAC 216 to supply current to or from the capacitive sensor 240. The amount of the current depends on the largest unused setting of the IDAC 216 and the time interval for which the current is supplied, while a determination whether current is to be added or drawn from the capacitive sensor 240 is made based on the SIGN signal.

The IDAC setting is accumulated using a digital accumulator (514). For example, at each iteration of the measurement sequence, when the control setting circuit 228 sends a signal to the IDAC 216, the signal is read by the compensation circuit 230. Upon reading the signal, the compensation circuit determines the amount of charge for the present iteration, and whether the charge is to be added to or removed from the capacitive sensor 240. Based on the determination, a value corresponding to the amount of charge is either added to, or removed from, the value that is accumulated using the digital accumulator circuit 232.

The measurement sequence continues and (508), (512) and (514) repeats in each iteration until the minimum current setting is reached. At that stage, the accumulated value is provided at the output (510) of the integrator, as described previously.

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. An apparatus comprising:
   a digital logic circuit coupled to an output of a comparator and to an input of a controllable current source, the digital logic circuit configured for controlling an amount of current supplied or drawn by the controllable current source, wherein the digital logic circuit comprises:
      a digital filter coupled to the output of the comparator, the digital filter configured for producing a filtered version of information provided at the output of the comparator;
      a delay circuit coupled to an output of the digital filter and configured for providing a delayed version of the filtered information produced by the digital filter;
      an exclusive-or (XOR) circuit coupled to the output of the digital filter and to an output of the delay circuit, the XOR circuit configured for providing an update signal;
      a control setting circuit coupled to the output of the digital filter and to an output of the XOR circuit for receiving the update signal, the control setting circuit further coupled to an input of the controllable current source and configured for controlling an active current configuration of the controllable current source; and
      a digital accumulator coupled to an output of the control setting circuit for measuring an amount of current supplied or drawn by the controllable current source, the digital accumulator configured for providing a result signal that is proportional to an amount of charge associated with an external source that is coupled to a first input of the comparator,
   wherein the apparatus is configured for measuring the amount of charge associated with the external source.

2. The apparatus of claim 1, wherein the digital logic circuit is configured to use successive approximation to control the amount of current supplied or drawn by the controllable current source such that a voltage at the first input of the comparator due to the charge associated with the external source approaches a reference voltage.

3. The apparatus of claim 1, wherein the apparatus is configured for providing a digital output proportional to the measured amount of charge associated with the external source, the digital output being provided without using an analog to digital converter (ADC) by the apparatus.

4. The apparatus of claim 1, wherein the apparatus is configured for integrating a current associated with the external source.

5. The apparatus of claim 1, wherein the apparatus is configured for measuring a voltage associated with the external source.

6. The apparatus of claim 1, wherein the apparatus is configured for measuring a capacitance associated with the external source.

7. The apparatus of claim 1, wherein the controllable current source includes a digital to analog circuit (DAC) that is configured for providing a current at the output of the controllable current source.

8. The apparatus of claim 1, wherein the digital logic circuit is configured for regulating a voltage at the first input of the comparator due to the external source by controlling the controllable current source such that the amount of the current supplied or drawn by the controllable current source is controlled.

9. The apparatus of claim 1, wherein the digital logic circuit comprises:
a compensation circuit coupled to the output of the control setting circuit and to an input of the digital accumulator, the compensation circuit configured for compensating the amount of current supplied or drawn by the controllable current source based on a digital lookup table, the compensated amount of current provided to the digital accumulator by the compensation circuit.

10. The apparatus of claim 1, wherein the delay circuit is configured to delay the filtered information produced by the digital filter by a time step of a clock signal provided to the digital logic circuit such that the output of the delay circuit follows the output of the digital filter delayed by the time step.

11. The apparatus of claim 10, wherein the update signal is based on a difference between the output of the digital filter and the output of the delay circuit, the update signal indicating when a voltage at the first input of the comparator due to the external source and the current supplied or drawn by the controllable current source crosses a reference voltage.

12. The apparatus of claim 11, wherein the control setting circuit is configured for providing control information for controlling the active current configuration of the controllable current source based on the update signal and the filtered information produced by the digital filter, the control information configured to drive the controllable current source to supply or draw current based on a sign of the filtered information produced by the digital filter.

13. The apparatus of claim 10, wherein a dynamic range or resolution of the apparatus is controlled by digitally controlling the time step of the clock signal.

14. The apparatus of claim 1, comprising a reset signal that is provided to the control setting circuit, the reset signal configured for resetting the control setting circuit to a base setting when a new measurement is to be made, the base setting of the control setting circuit configured to control the controllable current source such that a maximum amount of current is supplied or drawn by the controllable current source.

15. The apparatus of claim 14, wherein the reset signal is provided to the digital accumulator before a new measurement cycle, the reset signal configured for clearing a value accumulated in the digital accumulator from a previous measurement cycle.

16. The apparatus of claim 1, wherein the digital accumulator is configured for accumulating a value proportional to a measured amount of charge supplied to or drawn from the external source based on current supplied or drawn by the controllable current source and a time for which the current is supplied or drawn, an amount of the current being based on successive control information provided by the control setting circuit for controlling the active current configuration of the controllable current source during a measurement cycle.

17. The apparatus of claim 1, comprising:
a controllable voltage source coupled to a second input of the comparator and configured for providing a reference voltage.

18. The apparatus of claim 1, wherein the comparator is configured for measuring a difference in voltage between a source coupled to the first input and another source coupled to a second input of the comparator, and providing information associated with the measured difference at the output of the comparator.

19. A method comprising:
coupling an external source to a first input of a comparator included in an integrator circuit for measuring a voltage proportional to a first amount of charge associated with the external source;
adding, using a controllable current source included in the integrator circuit that is coupled to the external source, a supplementary charge to the external source based on a current provided by the controllable current source;
measuring, using the comparator, a difference between a voltage at the first input of the comparator due to the external source and a reference voltage at a second input of the comparator;
based on measuring the difference, adjusting an amount of the current provided by the controllable current source, the amount of the current being adjusted in successive time steps of a clock signal such that the voltage at the first input of the comparator approaches the reference voltage;
determining, based on an output of the comparator, whether the voltage at the first input of the comparator has crossed the reference voltage;
responsive to determining that the voltage at the first input of the comparator has crossed the reference voltage, adjusting the amount of the current provided by the controllable current source by decreasing the amount of the current and reversing a direction of the current;
accumulating, using a digital accumulator included in the integrator circuit, a value proportional to an amount of charge based on the current provided by the controllable current source and an amount of time for which current is provided by the controllable current source;
determining whether a minimum setting for the current provided by the controllable current source is reached; and
based on determining that the minimum setting for the current provided by the controllable current source is reached, providing at the output of the digital accumulator the accumulated value proportional to the amount of charge as an indication of the first amount of charge associated with the external source.

20. The method of claim 19, wherein adjusting the amount of the current provided by the controllable current source comprises:
providing a control signal to the controllable current source using a control setting circuit included in the integrator circuit, the control signal configured for controlling the controllable current source such that the amount of the current provided by the controllable current source is adjusted, and
wherein the control setting circuit generates the control signal based on an indication of the measured difference at the output of the comparator and the sign of the measured difference at the output of the comparator.

21. The method of claim 20, wherein the control setting circuit is configured to use successive approximation to adjust the amount of the current provided by the controllable current source such that the voltage at the first input of the comparator due to the external source approaches the reference voltage.

22. The method of claim 19, comprising:
controlling a dynamic range or resolution of the measurement associated with the amount of the current provided by the controllable current source by digitally controlling the time steps of the clock signal.

* * * * *